United States Patent

Tracy et al.

[19]

[11] Patent Number: 5,930,115
[45] Date of Patent: Jul. 27, 1999

[54] APPARATUS, METHOD AND SYSTEM FOR THERMAL MANAGEMENT OF A SEMICONDUCTOR DEVICE

[75] Inventors: Mark S. Tracy, Tomball; Minh H Nguyen, Houston; Curtis L. Progl, Montgomary, all of Tex.

[73] Assignee: Compaq Computer Corp., Houston, Tex.

[21] Appl. No.: 09/054,735

[22] Filed: Apr. 3, 1998

Related U.S. Application Data

[63] Continuation-in-part of application No. 08/703,342, Aug. 26, 1996, Pat. No. 5,737,187.

[51] Int. Cl.⁶ .................................................. H05K 7/20
[52] U.S. Cl. ..................... 361/704; 361/689; 361/699; 361/700; 361/709; 361/710; 361/719; 361/720; 257/706; 257/714; 257/715; 257/717; 165/80.4; 165/185; 174/15.1; 174/15.2; 174/16.3
[58] Field of Search ............................ 361/688, 689, 361/687, 698, 699, 700, 704, 707, 709, 714, 715, 719–721; 257/707, 706, 713–719; 165/80.2–80.4, 185; 174/15.1, 15.2, 16.3

[56] References Cited

U.S. PATENT DOCUMENTS

| | | | |
|---|---|---|---|
| 4,758,926 | 7/1988 | Herrell et al. | 361/699 |
| 5,475,563 | 12/1995 | Donahoe et al. | 361/695 |
| 5,757,615 | 5/1998 | Donahoe et al. | 361/687 |
| 5,764,483 | 6/1998 | Ohashi et al. | 361/699 |
| 5,784,256 | 7/1998 | Nakamura et al. | 361/699 |

*Primary Examiner*—Leo P. Picard
*Assistant Examiner*—Boris L. Chervinsky
*Attorney, Agent, or Firm*—Paul Katz; Frohwitter

[57] ABSTRACT

A thermal management structure to provide mechanical isolation and heat removal for an unpackaged semiconductor die mounted directly on a printed circuit board substrate. The thermal management structure sandwiches the unpackaged semiconductor die and substrate between two heat sink pieces which are rigidly mounted to the substrate, thereby mechanically isolating the unpackaged semiconductor die and preventing the die from being accidentally touched. The two heat sink pieces further compliantly thermally engage selected sites on the exposed face of the semiconductor die and the surface of the substrate to conductively remove heat away from the substrate. The thermal management structure may also provide electromagnetic shielding which isolates the electromagnetic fields generated by the substrate from electromagnetic fields external to the thermal management structure. The thermal management structure may also thermally engage selected thermally conductive components within an end product to spread the heat more uniformly throughout the system.

47 Claims, 13 Drawing Sheets

APPARATUS, METHOD AND SYSTEM FOR THERMAL MANAGEMENT OF A SEMICONDUCTOR DEVICE

CROSS REFERENCE TO RELATED PATENT APPLICATION

This patent application is a continuation-in-part of U.S. patent application Ser. No, 08/703,342, filed Aug. 26, 1996, now U.S. Pat. No. 5,737,187, entitled "Apparatus, Method and System for Thermal Management of an Unpackaged Semiconductor Device," by Minh H. Nguyen and Mark S. Tracy, and is incorporated by reference herein.

BACKGROUND OF THE INVENTION

1. Field of the Invention

The present invention relates generally to an apparatus, method and system for thermal management of a semiconductor device, and, more particularly, to an apparatus, method and system for mechanical isolation combined with removal and dissipation of heat generated by a high clock frequency, high circuit density unpackaged chip-on-board semiconductor device.

2. Description of the Related Technology

Ever increasing market pressure for smaller, faster, and more sophisticated end products using integrated circuits has driven the electronics industry to develop integrated circuits which occupy less volume yet operate at heretofore unheard of clock frequencies employing incredible circuit densities. For example, two current production integrated circuits which serve as microprocessors are manufactured by the Intel Corporation called the PENTIUM (PENTIUM is the registered trademark of the Intel Corporation) and the PENTIUM II (PENTIUM II is the registered trademark of the Intel Corporation). The PENTIUM has over 3 million circuits in a single semiconductor die using 0.6 to 0.35 micron technology, operates at speeds ranging up to 266 MHz. The PENTIUM II has over 10 million circuits in a single semiconductor die and operates at speeds ranging up to 333 MHz, and is projected to soon exceed 400 MHz.

Because of the fragility of integrated circuit dice, and their susceptibility to environmental influences and mechanical trauma, individual or multiple integrated circuit dice have traditionally been enclosed in a protective "package" such as Pin Grid Array ("PGA") or Ball Grid Array ("BGA"). These packages may be made of plastic or ceramic materials, and provide electrical leads so that the enclosed die (or dice) may be electrically connected to a substrate, such as a printed circuit board ("PCB").

As the end products which utilize these increasingly powerful integrated circuits continue to shrink in size, such as laptop computers and other consumer, commercial, and military electronics, the space available for mounting the packaged integrated circuit die (or dice) is also reduced. Unfortunately, as integrated circuits grow in complexity and circuit density, the number of package leads needed to connect the packaged die (or dice) to the substrate also increases, thereby requiring more, not less, area to provide reliable electrical interconnections between the surface mount package to the substrate. Further, as the number of package leads increases, so does the capacitance, inductance and resistance of the package leads, which can degrade signal fidelity to and from the die (or dice).

In an effort to eliminate the above problems associated with modern packaging, some integrated circuit manufacturers have eliminated packages, and placed the unpackaged integrated circuit die (or dice) directly on the substrate. This practice of connecting unpackaged die (or dice) directly on a substrate is generically referred to as "chip-on-board" packaging.

An example of chip-on-board technology which is currently being manufactured and sold is the Intel Corporation's TCP PENTIUM ®. The TCP PENTIUM ("TCP" stands for Tape Carrier Packaging) is a version of the PENTIUM in which the microprocessor integrated circuit die is an unpackaged die mounted face up on a PCB substrate and electrically connected to the PCB substrate using tape automated bonding technology. The PCB substrate also has numerous other integrated circuit packages directly connected to the substrate. When multiple dice are mounted on the same substrate, whether some or all are packaged or unpackaged, the combination is usually referred to as a multi chip module ("MCM").

Chip-on-board die leads may be electrically connected to the substrate face down using solder ball bonding (also known as "flip-chip") or in either a face down or face up arrangement using tape automated bonding ("TAB"). The exposed face of the die (i.e. the face opposite the face directly connected to the substrate) may be covered with a mechanically protective encapsulent.

The move to unpackaged chip-on-board technology has overcome some of the problems associated with higher clock speeds and circuit densities, but as is often the case, a successful solution to one problem often creates one or more new problems which must be addressed. One problem with unpackaged dice is that although advances in passivation allow unpackaged dice to withstand normal environmental influences better, unpackaged dice are still fragile and easily damaged by very minor external mechanical trauma, whether or not the dice are topped with an encapsulent. Although traditional component boards and MCM's (i.e. those having only packaged dice) have always been regarded and treated as delicate, this has usually been due to the risk of static electric discharge during handling which could damage the integrated circuits, not the mere accidental touching of a packaged die on a substrate board. An unpackaged die (or dice) with an encapsulent cap generally should not be subjected to more than 4.5 kilograms (9.9 pounds) of force on the center of the exposed face, however, lower forces may be damaging depending on the specific design parameters of a given die (or dice). A human hand in the mere act of touching an object, typically can and will exert forces greater than 4.5 kilograms.

Component boards and MCM's are usually fabricated at one location and then transported to either a component assembly location of either the original equipment manufacturer or a third party assembler. Sometimes, the component boards and/or MCM's are sold directly to end users who either need to repair or upgrade existing end products. This presents component manufacturers with the dilemma of shipping factory tested known good boards and MCM's having unpackaged dies, only to experience a higher than acceptable mortality rate in the course of normal shipping, and more often than not, normal handling by third party assemblers or end users.

Another problem with an unpackaged die (or dice) is related to the dissipation of waste heat generated by the die (or dice), also known as thermal management. As clock frequency and circuit density increase and die size decreases, the die power density and resulting production of waste heat also increase. As the quantity of waste heat increases, the effective steady state operating temperature of the die may also increase. If the steady state operating temperature of the die becomes greater than the maximum functional operating temperature of the die, the integrated circuit die may suffer degraded performance and/or experience logic errors. If the steady state operating temperature of the die becomes high enough, the die may experience errors in clock timing potentially causing the chip and/or system to lock-up. If the temperature becomes extremely high, the die may become permanently damaged and fail.

In addition to thermal performance degradation and/or damage, another problem of chip-on-board technology associated with increased waste heat is caused by the differences in the thermal coefficients of expansion ("TCE") between the die and the substrate, commonly referred to as TCE mismatch. Integrated circuit dice are composed of silicon whereas most substrates are composed of organic materials. The TCE of organic substrates are much greater than the TCE of silicon dice, therefore as temperature increases the organic substrates expand more than the silicon dice. Further, in a powered state, unpackaged dice conductively transfer most of their generated waste heat to the substrate. Therefore when an end product containing a chip-on-board die is turned on, the die temperature rises from the ambient temperature to the steady state operating temperature, which also raises the temperature of the organic substrate. Because of the TCE mismatch, the substrate expands more than the chip-on-board die. This condition results in a large mechanical stress being placed on the mechanically fragile die and the electrical connections to the substrate. Repeated power cycling can result in mechanical fatigue and eventual failure of die or the electrical connections, thereby destroying the use and/or value of the end product.

The present accepted solution for thermal management and TCE mismatch of unpackaged dice is to use the substrate, with or without thermal vias at the die attachment site, as a heat sink wherein the waste heat generated by the unpackaged die (or dice) is conductively transferred from the die to the substrate where the heat is both conductively transferred away from the die in the substrate and also convectively and radiantly transferred from the substrate to the ambient environment. If additional thermal enhancements are required, such as an externally attached heat sink, the heat sink is attached to the side of the substrate opposite the side where the unpackaged die is mounted. If an external heat sink is attached to the substrate, this provides an additional conductive path to transfer heat away from the die to the substrate, and then on to the external heat sink, where the heat is radiantly and convectively transferred to the ambient environment. Unfortunately, with the current trend of increasing power densities and consequent increasing waste heat generation of unpackaged die (or dice), these thermal management techniques are limited at best and more likely unacceptably inadequate.

Another problem associated with increasing clock speeds of semiconductor devices is that of radio frequency interference ("RFI"), also known as electromagnetic interference ("EMI"). Current production semiconductor dice are operating at speeds which are the same as radio frequencies used in wireless communications. For example, United States television channel 13 operates at approximately the 210 MHz frequency, while at the other end of the spectrum analog cellular telephones both receive and transmit at frequencies centered at approximately 880 MHz. Further, semiconductor devices can both emanate (transmit) and intercept (receive) electromagnetic fields at the operating (fundamental) frequency of the semiconductor device, as well as, at other (harmonic) frequencies greater than the operating frequency. Both emanation and interception of electromagnetic fields is often undesirable. Emanation of undesired electromagnetic fields can interfere with proper operation of nearby electrical devices or radio signal reception/transmission, whereas interception of strong radio signal transmissions (such as from a nearby cellular phone) could possibly cause a semiconductor device to malfunction and produce erroneous output. Additionally, the Federal Communications Commission ("FCC") has issued regulations which require that semiconductor devices and electronic systems not emanate radio frequencies above certain very low power levels (Part 15 of FCC Rules).

What is needed is a apparatus, method and system to provide the necessary thermal management of high power density packaged or unpackaged dice during normal operation, which minimizes both emanation and interception of electromagnetic fields by packaged or unpackaged high frequency dice, and which also protects unpackaged dice from mechanical trauma during normal transportation, handling, installation, and operation.

SUMMARY OF THE INVENTION

Objects of the Invention

It is therefore an object of the present invention to create an apparatus, method and system to manage heat removal and dissipation from one or more packaged or unpackaged, high speed, high circuit density semiconductor dice mounted on a chip-on-board substrate.

Another object of the present invention is to create an apparatus, method and system to provide mechanical isolation and protection for one or more packaged or unpackaged, high speed, high circuit density semiconductor dice mounted on a chip-on-board substrate.

Another object of the present invention is to create an apparatus, method and system to provide electromagnetic shielding (isolation) for one or more packaged or unpackaged, high speed, high circuit density semiconductor dice mounted on a chip-on-board substrate.

A further object is to create an apparatus, method and system to modularize into a single unit one or more packaged or unpackaged, high speed, high circuit density semiconductor dice mounted on a chip-on-board substrate with a mechanically protective thermal management device.

A further object is to create an apparatus, method and system to modularize into a single unit one or more packaged or unpackaged, high speed, high circuit density semiconductor dice mounted on a chip-on-board substrate with a mechanically protective and electromagnetic isolating thermal management device.

Another object of the present invention is to create an apparatus, method and system to remove and dissipate heat produced by a semiconductor device having at least one unpackaged semiconductor die mounted on a chip-on-board substrate.

Another object of the present invention is to create an apparatus, method and system to isolate a semiconductor device having at least one unpackaged semiconductor die mounted on a chip-on-board substrate from electromagnetic fields external to the semiconductor device.

Yet another object is to create an apparatus, method and system to provide a single module semiconductor device having one or more unpackaged semiconductor dice on a substrate with improved thermal management in a mechanically protective enclosure which may be shipped, handled, installed in an end product and operated in an end product with minimized chance of mechanical and/or thermal damage of the one or more semiconductor dice.

Yet another object is to create an apparatus, method and system to provide a single module semiconductor device having one or more unpackaged semiconductor dice on a substrate with improved thermal management and electromagnetic shielding in a mechanically protective enclosure which may be shipped, handled, installed in an end product and operated in an end product with minimized chance of mechanical and/or thermal damage of the one or more semiconductor dice.

Yet another object is to create an apparatus, method and system to provide a single module semiconductor device having one or more unpackaged semiconductor dice on a substrate with improved thermal management in a mechanically protective enclosure which may be handled and installed in an end user's existing end product by an original component manufacturer, a third party or an end user to replace or upgrade a damaged or outdated semiconductor device in the end user's existing end product with minimized chance of mechanical damage of the one or more unpackaged semiconductor dice.

An advantage of the present invention is the ability to upgrade an existing end product such as a laptop computer by replacing an existing semiconductor device (not employing the invention) contained within an end product chassis with a higher speed and/or higher circuit density semiconductor device (which employs the invention) having a higher heat output without modifying, or with minimal modification, of the passive or active cooling system of the end product, by conducting the additional heat more uniformly throughout the existing available space within the chassis.

Another advantage of the present invention is the ability to upgrade an existing end product such as a laptop computer by replacing an existing semiconductor device (not employing the invention) contained within an end product chassis with a higher speed and/or higher circuit density semiconductor device (which employs the invention) which has electromagnetic shielding without modifying, or with minimal modification, of the end product.

A novel feature of the present invention is the ability to remove and dissipate the heat generated by one or more unpackaged semiconductor dice on a substrate by compliantly engaging the exposed face or faces of the one or more dice with minimal compressive force.

Additional objects, advantages and novel features of the invention will be set forth in part in the description which follows, and in part will become apparent to those skilled in the art upon examination of the following or may be learned by practice of the invention. The objects, advantages and novel features of the invention may be realized and attained by means of the instrumentalities and combinations particularly pointed out in the appended claims.

Disclosure of the Invention

According to the present invention, the foregoing and other objects, advantages and features are attained by a thermal management structure which sandwiches both sides of a chip-on-board substrate. The thermal management structure provides an unpackaged die (or dice) and any packaged die (or dice) on the chip-on-board substrate with both a mechanical protective cover and maximum conductive heat transfer interface contacts to a heat sink mass. In an aspect of the invention, the thermal management structure also shields (isolates) the chip-on-board substrate from the electromagnetic environment external to the thermal management device.

The mechanical protective cover aspect of the invention allows the chip-on-board substrate to be shipped, handled, installed, and operated with minimal risk of the unpackaged die or dice, as well as any packaged dice, being physically damaged by an accidentally touching with a human hand, tool, shipping carton, end product component or other foreign object. The maximum conductive heat transfer interface aspect of the invention allows a heat sink mass to be compliantly thermally engaged to both the side of the substrate opposite the side where the packaged or unpackaged die is mounted (hereinafter "board side") as well as to the fragile exposed face of the die, whether or not the die has an encapsulent top (hereinafter "exposed face").

By providing the maximum conductive heat transfer interface with both the exposed face of the packaged or unpackaged die and the board side of the substrate, the thermal gradient across the die and the substrate immediately attached to the die is reduced, thereby reducing the ultimate steady state operating temperature of the die and the substrate for a given ambient temperature. By reducing the ultimate steady state operating temperature, the likelihood of thermal performance degradation, damage, or TCE mismatch induced failure of the packaged or unpackaged die is considerably reduced.

According to another aspect of the invention, the thermal management structure comprises a heat sink mass having a first heat sink piece and a second heat sink piece. Both heat sink pieces have corresponding offsetting mounting brackets (or tabs) which align with mounting sites in the chip-on-board substrate. The offsetting mounting brackets serve to align and fixedly attach the first and second heat sink pieces with the chip-on-board substrate in a predetermined configuration. The offsetting mounting brackets further act as spacers which define and maintain a predetermined minimum distance between an inside face of the respective heat sink piece with the corresponding side of the chip-on-board substrate and any packaged or unpackaged chips thereon.

Mechanically compliant and thermally conductive interface pads are interposed between the inside face of the respective heat sink piece and selected locations on either the packaged or unpackaged die exposed face or the substrate board side. Each interface pad has a predetermined thickness which corresponds to the distance between the inside face of the respective heat sink piece with the corresponding selected location on the die exposed face or the substrate board side between which the interface pad is interposed. For any selected location, by judiciously selecting the tolerances and allowances of the interface pad thickness and the offset of the mounting brackets, the interface pad will compliantly conform to surfaces of both the inside face of the heat sink piece and the selected locations on either the die exposed face or the substrate board side. This will allow maximum conductive thermal interface contact between the substrate or die exposed face with the heat sink piece while subjecting the selected location to minimum mechanical loading forces.

According to another aspect of the invention, one of the two heat sink pieces may have a lip which is shaped and sized to both encircle the edges of the substrate and electromagnetically seal against the inside surface of the other heat sink piece thereby providing an electromagnetic shield around the substrate. The lip may be fabricated to closely contour one or more edges of the substrate to further assist in the alignment of the substrate in a predetermined configuration with the one heat sink piece and its mounting brackets. The lip further acts as a spacer which defines and maintains a predetermined minimum distance between the inside faces of the two heat sink pieces.

According to another aspect of the invention, the first and second heat sink pieces may be shaped and sized to provide heat removal from the chip-on-board substrate via conduction to distant points in the heat sink, and by convection and radiation from the heat sink to the ambient environment, while conforming to the space available in the end product to install the chip-on-board substrate. Either or both of the first and second heat sink pieces may have projections which extend, and/or project out of, the main plane of the heat sink piece to enhance conductive heat removal to distant points. Either or both of the heat sink pieces may have extended surfaces, such as pins, fins or the like which increase the surface area to mass ratio of the heat sink piece to enhance passive or forced convective heat removal to the ambient environment. Further, either or both of the heat sink pieces may have heat pipe receptacles for holding heat pipes. The heat pipe receptacles may extend, and/or project out of, the main plane of the heat sink piece to enhance heat removal to distant points, or may be placed near the substrate to more evenly distribute waste heat across the heat sink piece.

According to another aspect of the invention, the thermal management structure may be used with a substrate assembly of two substrates arranged and interconnected as parallel planes (or bi-planar) which operate as a single unit.

According to another aspect of the invention, the thermal management structure may be used with a substrate or substrate assembly which has been enclosed in a thin walled enclosure.

According to another aspect of the invention, either or both of the first and second heat sink pieces may be designed to further compliantly and/or fixedly thermally engage other components in the end product capable of acting as heat spreaders to further conductively remove heat away from both the heat sink and the chip-on-board substrate. Such heat spreaders may be chassis or case components of the end product, for example a portable computer keyboard assembly, chassis, frame or case.

Other and further objects, advantages and novel features will be apparent from the following description of the presently preferred embodiments of the invention, given for the purpose of disclosure and taken in conjunction with the accompanying drawings.

DETAILED DESCRIPTION OF PREFERRED EMBODIMENTS

Figure 1:
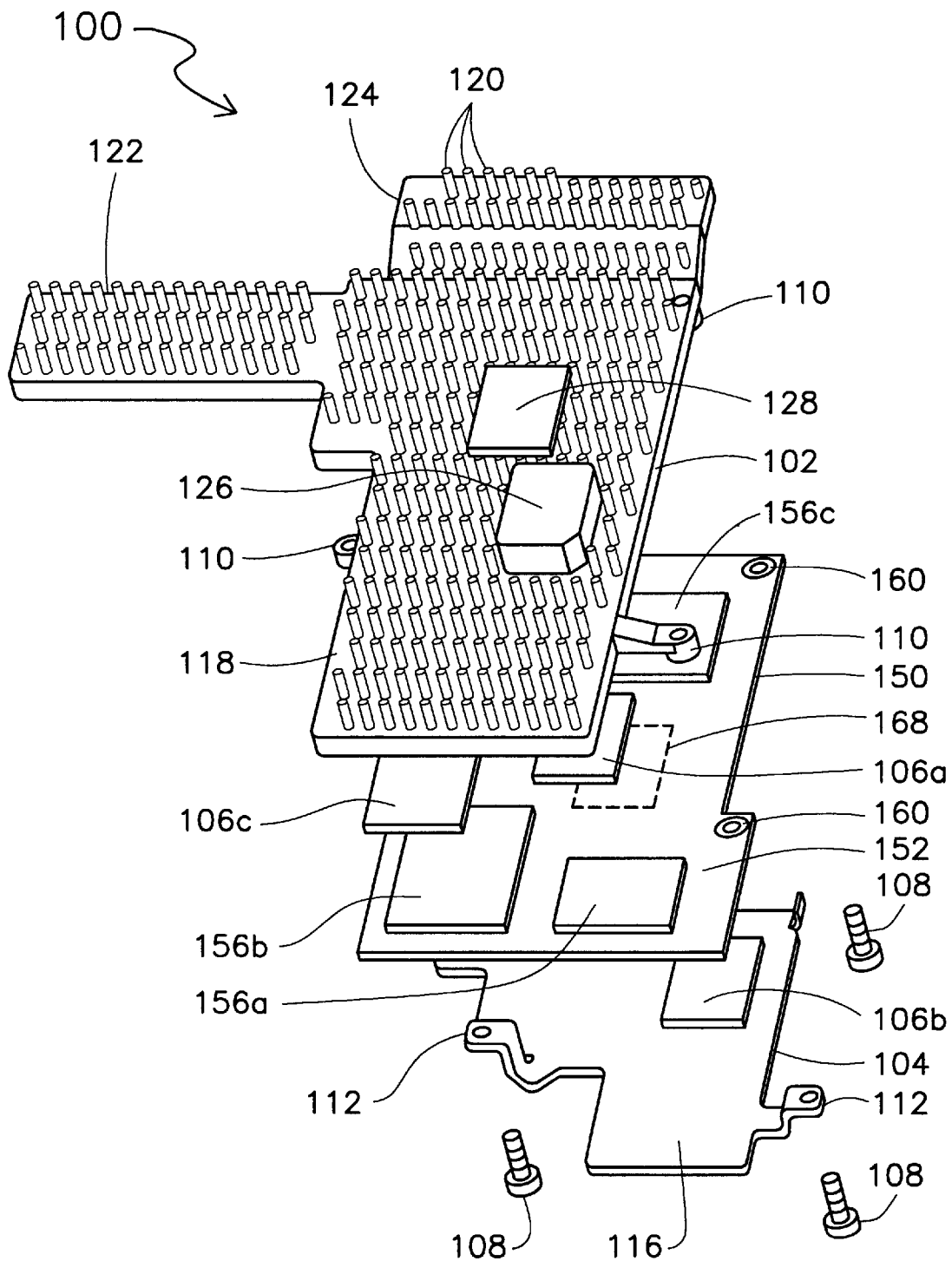
FIG. 1 is an exploded perspective view of an embodiment of the thermal management structure.

A better understanding of the present invention and the preferred embodiments will be obtained when the following detailed description is read with reference to the drawings. Like elements in the drawings are represented by like number, and similar elements are represented by like numbers with a different lower case letter suffix.

Figure 2:
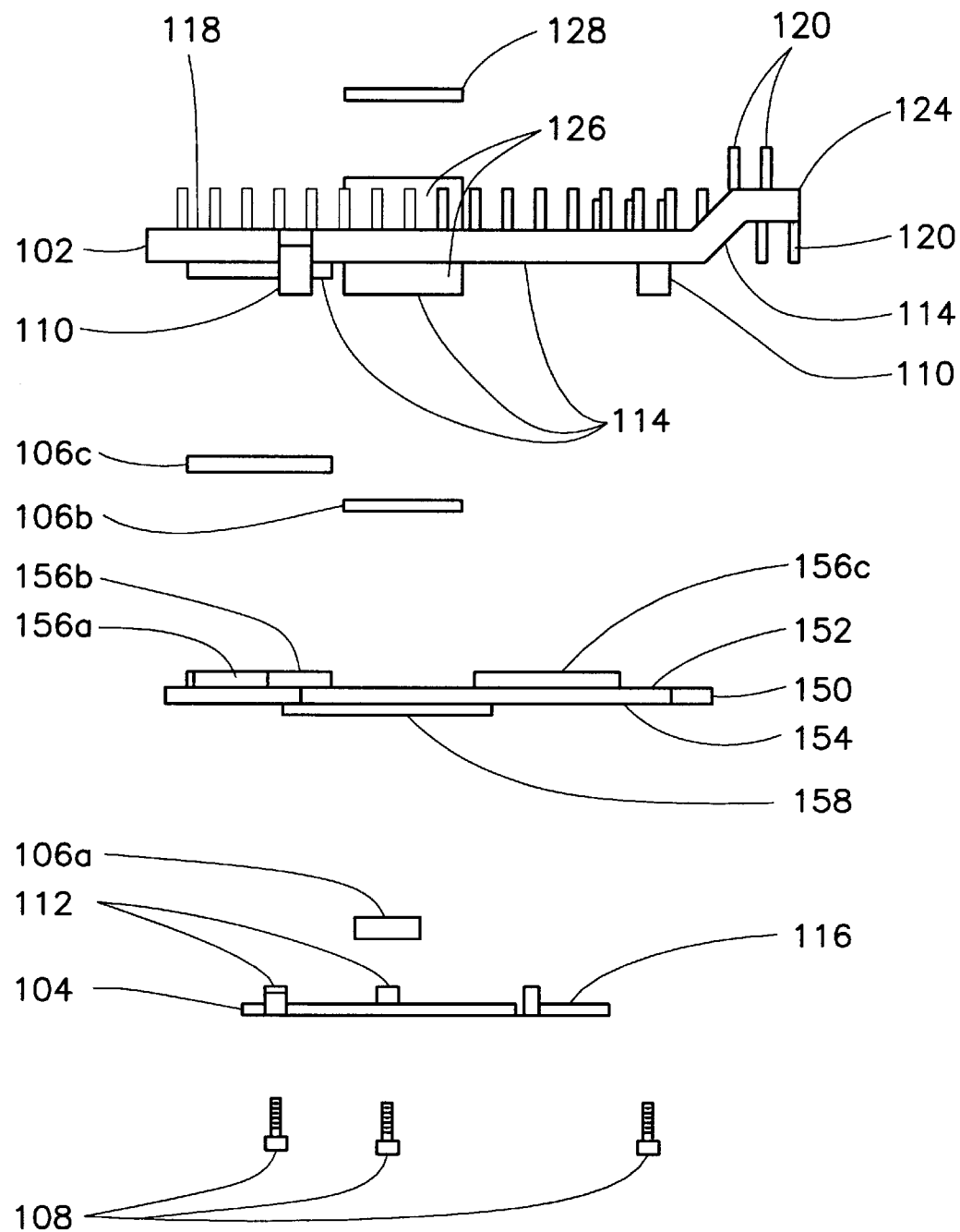
FIG. 2 is an exploded front elevation view of an embodiment of the thermal management structure.

Referring now to FIGS. 1 and 2, a thermal management structure 100 is illustrated in exploded perspective view and exploded front elevation view respectively. The thermal management structure 100 comprises four main parts: a first heat sink piece 102, a second heat sink piece 104, a plurality of thermal interface pads 106a, b and c, and a plurality of fasteners 108.

The thermal management structure 100 is in a thermal and mechanical functional cooperation with a chip-on-board substrate 150. The chip-on-board substrate 150 has a first side 152 and a second side 154, a plurality of packaged 15 dice 156a, b and c, an unpackaged die 158 (best viewed in FIG. 2), and a plurality of mounting sites 160 (best viewed in FIG. 1). For the purpose of illustrative clarity, and not limitation, the plurality of mounting sites 160 are illustrated as holes, however, it is contemplated and with in the spirit of the present invention that some or all of the mounting sites may be holes, slots, grooves, pins or the like.

For the purpose of illustrative clarity, and not limitation, the plurality of packaged dice 156a, b and c are mounted on the first side 152 of substrate 150 and the unpackaged die 158 is mounted on the second side 154 of substrate 150 (best viewed in FIG. 2). The selection, number and relative positioning of unpackaged and packaged dice on a given substrate is outside the scope of the present invention. It is contemplated, however, and within the scope of the present invention, that the thermal management structure 100 may be adapted to functionally cooperate with a wide variety of unpackaged and packaged dice mounted on either or both sides of a substrate.

Sites on the chip-on-board substrate 150 are selected which have sufficient waste heat generation so as to require thermal enhancement to remove the waste heat. It is contemplated and within the scope of the present invention, that a chip-on-board substrate may have only one site or a plurality of sites which may require thermal enhancement to remove generated waste heat. For the purpose of illustration, and not limitation, it should be assumed that the packaged die 156b and the unpackaged die 158 both generate sufficient waste heat and require thermal enhancement, whereas packaged dice 156a and c have minimal waste heat generation and do not require thermal enhancement.

Figure 2A:
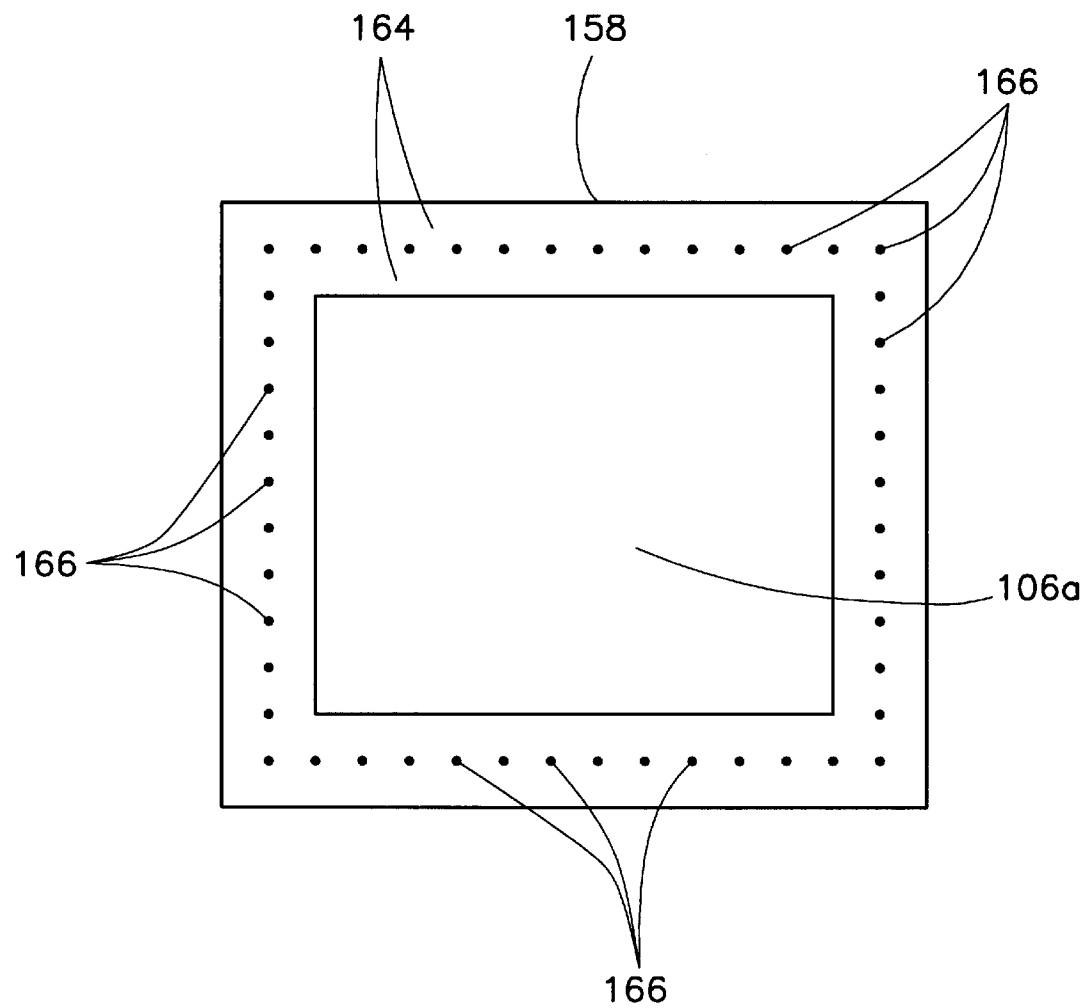
FIG. 2a is an bottom plan view of an aspect of an unpackaged die and an interface pad.
Figure 3:
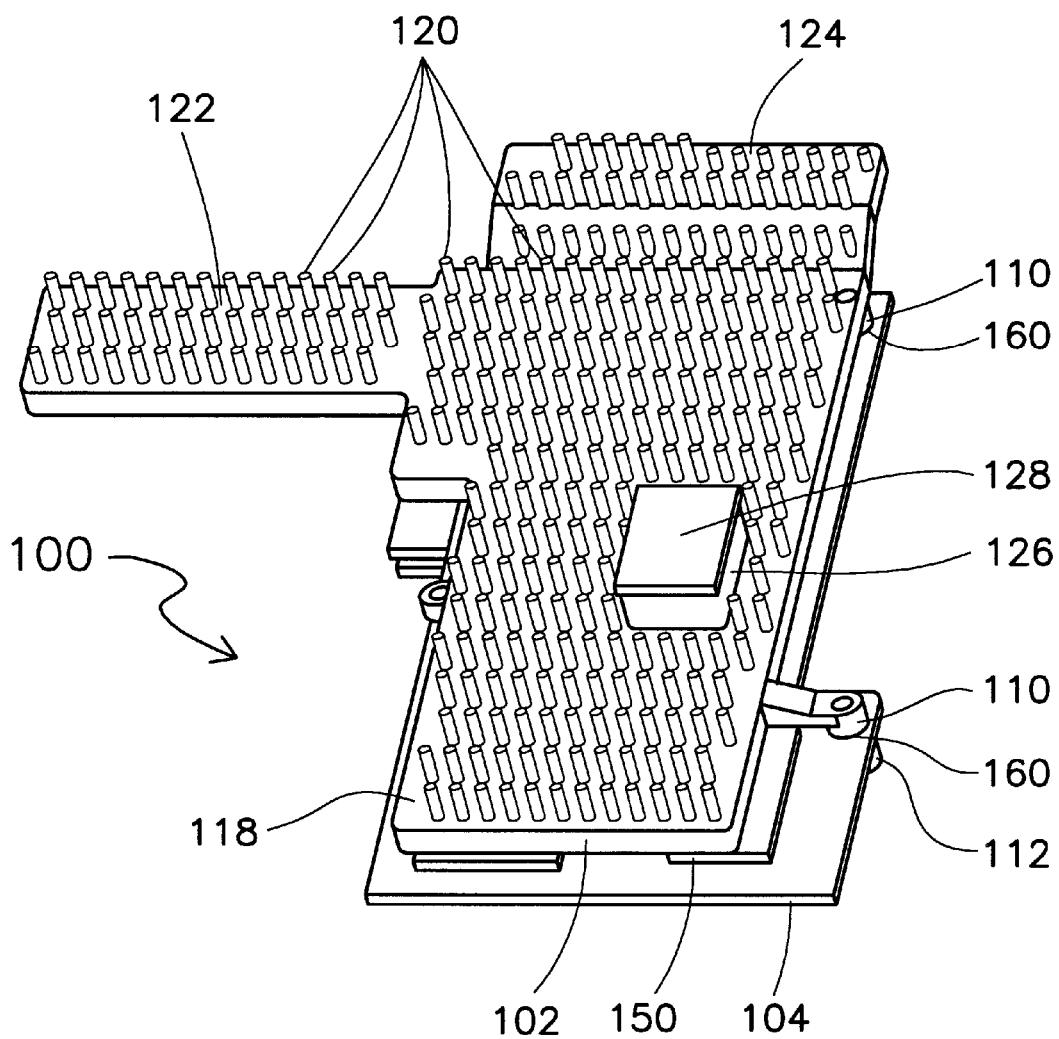
FIG. 3 is a perspective view of an embodiment of the thermal management structure.

Thermal interface pads 106a, b and c are selected and sized to engage the selected sites on the chip-on-board substrate 150 requiring thermal enhancement. Preferably the length and breadth of the thermal interface pads will be equal to or less than the corresponding length and breadth of the selected sites. If a selected site is an exposed face of a face up unpackaged chip, care should be exercised to not directly overlay or mechanically load the bond pads or electrical interconnections which typically are disposed along the outer periphery of the die, whether or not the exposed face is encapsulated. As best illustrated in FIG. 2a, a bottom plan view of the unpackaged die 158 is illustrated. Here unpackaged die 158 is in a face up configuration. The exposed face 164 has a plurality of bond pad locations 166 which are near the periphery of die 158. The interface pad 106a is centrally located and disposed on the exposed face 164 so that the interface pad 106a does not overlay or mechanically load the plurality of bond pad locations 166.

The interface pads 106a, b and c, are a mechanically compliant and thermally conductive material. Preferably the interface pads 106a, b and c are aluminum oxide filled silicone elastomer pads. It is contemplated and within the scope of the present invention, however, the interface pads 106a, b and c may be a thermally conductive grease, thermally conductive wax, thermally conductive elastomeric pad or the like, provided the interface pad is mechanically compliant and thermally conductive.

Referring again to FIGS. 1 and 2, the interface pads 106a, b, and c are interposed between the selected sites on the chip-on-board substrate 150 and either a first inside face 114 of the first heat sink piece 102 or a second inside face 116 of the second heat sink piece 104. Interface pad 106a is interposed between the exposed face 164 of unpackaged die 158 and the second inside face 116 of the second heat sink piece 104. Interface pad 106b is interposed between the "board side" of the unpackaged die 158 (i.e. the side of substrate 150 immediately opposite the side where the unpackaged die 158 is mounted), represented by the dotted line 168 in FIG. 1, and the first inside face 114 of the first heat sink piece 102. Interface pad 106c is interposed between the packaged die 156b and the first inside face 114 of the first heat sink piece 102.

The first and second heat sink pieces 102 and 104 preferably are fabricated from an aluminum alloy. It is contemplated and within the scope of the present invention, however, that the first and second heat sink pieces 102 and 104, respectively, may be fabricated from a magnesium alloy, a copper alloy, a beryllium copper alloy, a beryllium aluminum alloy, a carbon fiber composite, a thermal filled plastic or any other material with good thermal conductive properties and mechanical rigidity. It is further contemplated and within the scope of the present invention that either or both the first and second heat sink pieces 102 and 104 may be fabricated by die casting, stamping, extruding, molding, injection molding, powdered metal forming or the like.

Preferably the first heat sink piece 102 is fabricated by die casting and the second heat sink piece 104 is fabricated by stamping. Most preferably the first heat sink piece 102 is fabricated from die cast Aluminum 413 Alloy and the second heat sink piece 104 is fabricated from a stamped Aluminum 1100 Alloy.

It is contemplated and within the scope of the present invention, however, that the second heat sink piece 104 may be fabricated by die casting.

The first heat sink piece 102 has a plurality of first offsetting mounting brackets 110, and the second heat sink piece 104 has a plurality of second offsetting mounting brackets 112. The first plurality of offsetting mounting brackets 110 correspond and align with the plurality of mounting sites 160 on the substrate 150, which further correspond and align with the plurality of second offsetting mounting brackets 112.

Referring now to FIGS. 3, 4, 5, and 6, the thermal management structure 100 is illustrated in a perspective view, front elevation view, top plan view, and bottom plan view, respectively. Here the thermal management structure 100 is in an assembled form in functional cooperation with the chip-on-board substrate 150.

The first offsetting mounting brackets 110 align with the mounting sites 160 and rigidly engage the first side 152 of substrate 150. The second offsetting mounting brackets 112 align with the mounting sites 160 and rigidly engage the second side 154 of substrate 150. Fasteners 108 are used to fasten and firmly secure the first offsetting mounting brackets 110 to the second offsetting mounting brackets 112, thereby sandwiching the chip-on-board substrate in an unmoving relationship between the first heat sink piece 102 to the second heat sink piece 104, and also compressing the interposed interface pads 106a, b and c. By sandwiching and fixedly fastening the chip-on-board substrate 150 between the first and second heat sink pieces 102 and 104, the fragile unpackaged die 158 is mechanically isolated and therefore much less likely to be subjected to mechanical trauma during normal handling.

The fasteners 108 are preferably screws, however, it is contemplated and within the scope of the present invention that alternate fastening means may be employed, such as bolts and nuts, pins, clips, adhesives, glues, epoxies or the like.

Figure 4:
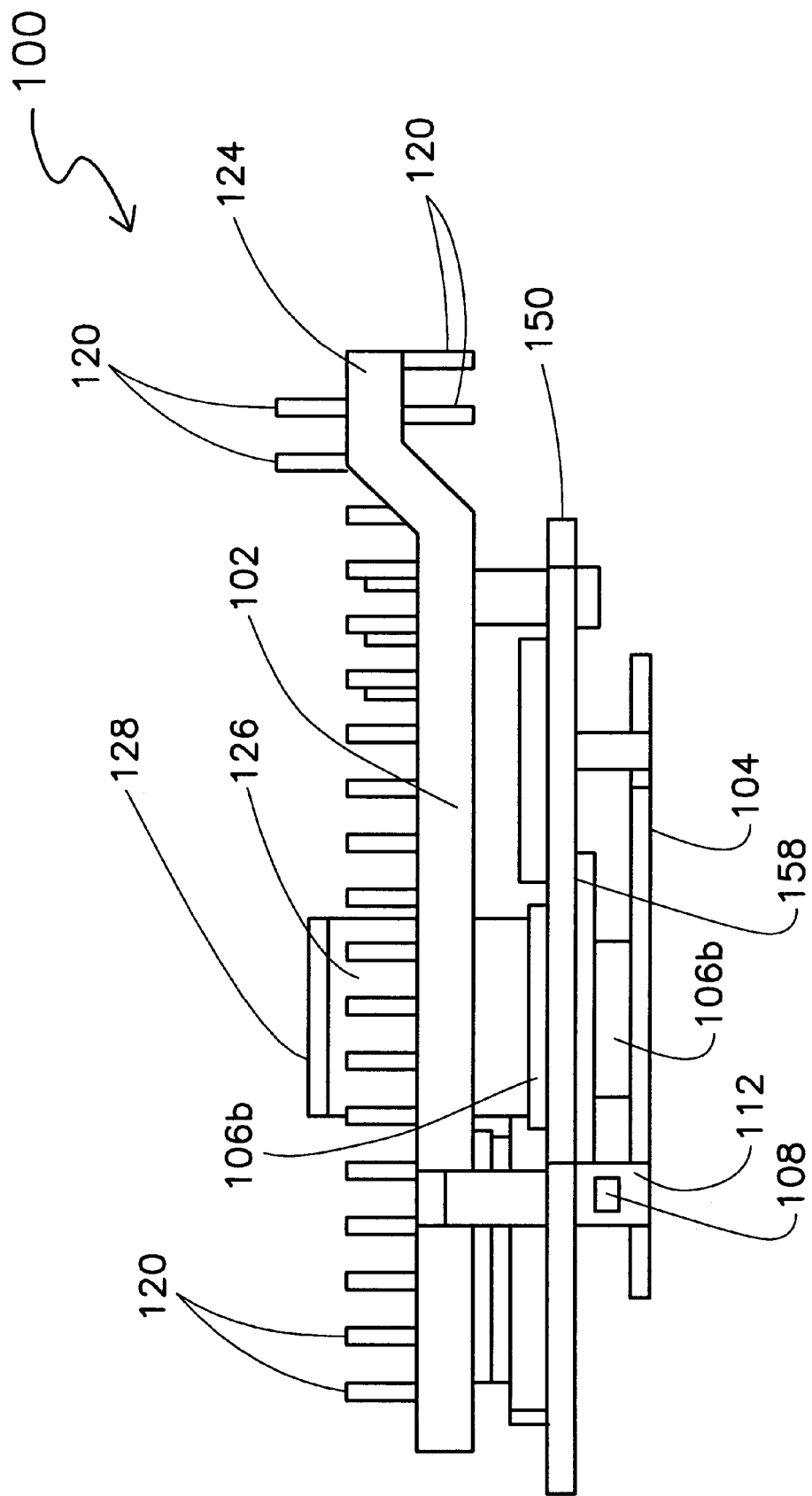
FIG. 4 is a front elevation view of an embodiment of the thermal management structure.
Figure 5:
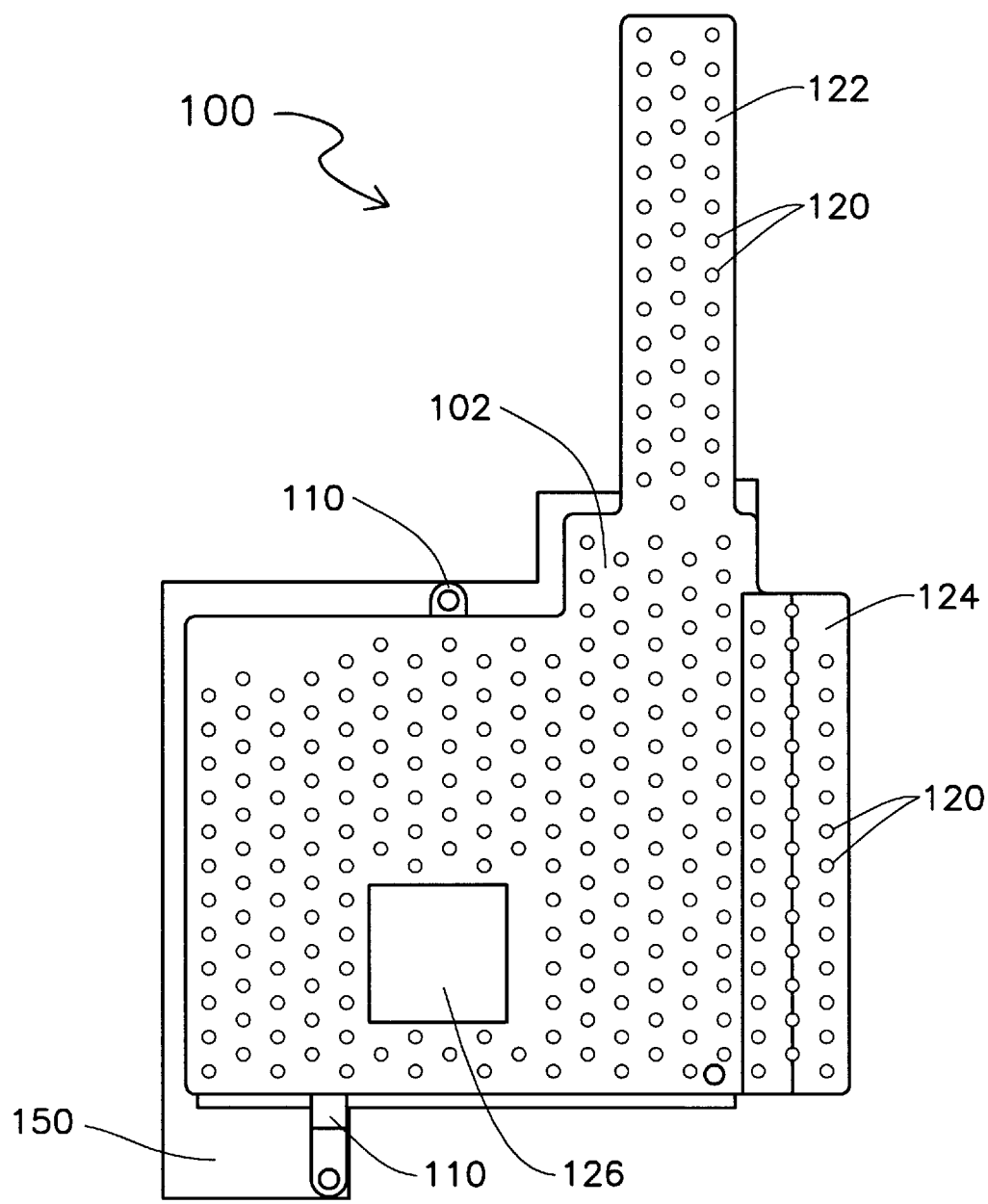
FIG. 5 is a top plan view of an embodiment of the thermal management structure.
Figure 6:
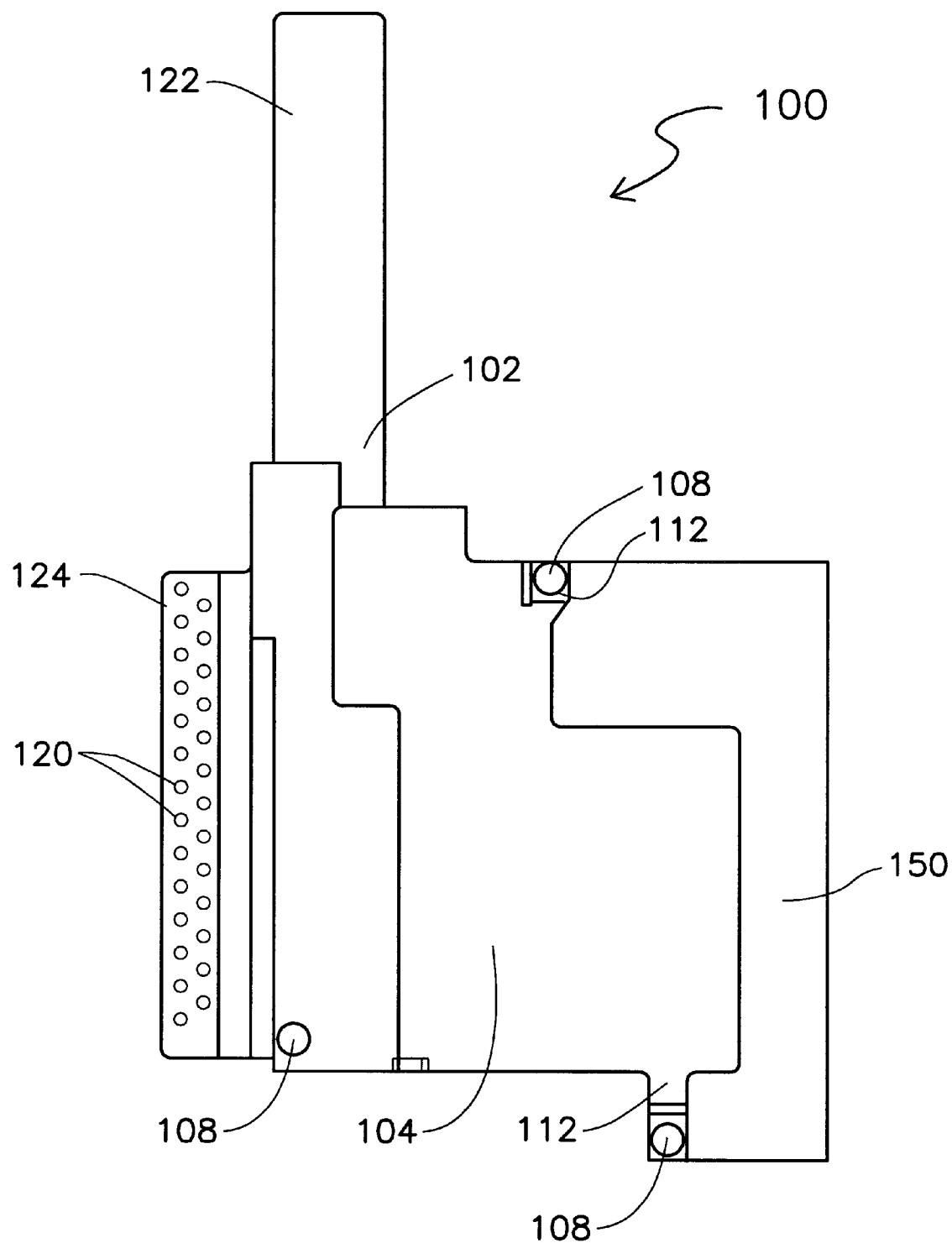
FIG. 6 is a bottom plan view of an embodiment of the thermal management structure.

As best viewed in FIG. 4, the thermal interface pad 106a compliantly engages and thermally interconnects the exposed face 164 of the unpackaged die 158 with the second heat sink piece 102. Similarly, thermal interface pad 106b compliantly engages and thermally interconnects the board side 168 of the substrate 150 with the first heat sink piece 104. Thermal interface pad 106c compliantly engages and thermally interconnects the packaged die 156b with the first heat sink piece 104.

The thicknesses of the respective interface pads 106a, b and c should each be slightly greater than the distances separating the respective surfaces which they each thermally interconnect. By so doing each interface pad will be provided with sufficient compressive force to conform the interface pad to the respective surfaces, while simultaneously not subjecting the unpackaged die 158 or substrate 150 to any damaging compressive force or deflection.

Referring to FIGS. 1, 2, 3, 4, and 5 an aspect of the present invention is illustrated. An outer face 118 of the first heat sink piece 102 is selectively populated with a plurality of extended surfaces 120 which are thermally conductive. The plurality of extended surfaces 120 increase the surface area to mass ratio, thereby increasing the convective and radiant transfer of heat to the ambient environment. Preferably the plurality of extended surfaces 120 are pins, and most preferably are cylindrical pins. It is contemplated and within the scope of the present invention, however, that the plurality of extended surfaces 120 may be ribs or pins, and the pins may have a non-circular cross-section (i.e. non-cylindrical) such as elliptical, rectangular, square or the like. It is contemplated and within the scope of the present invention that a plurality of extended surfaces may be selectively located on either, both, or neither the first heat sink piece 102 and/or the second heat sink piece 104.

Another aspect of the present invention is that the first heat sink piece 102 and the second heat sink piece 104 can each be shaped and sized independent of each other to conform to the space available in a specific end product while providing heat conduction pathways to cooler distant points in the end product. For the purposes of illustration, and not limitation, the first heat sink piece 102 has a first projection 122 which extends the heat sink mass in the plane of the first heat sink piece 102 (best viewed in FIGS. 1, 3, 5 and 6) and a second projection 124 which extends the heat sink mass out of the plane of the first heat sink piece 102 (best viewed in FIGS. 1, 2, 3 and 4).

It is further contemplated and within the scope of the present invention that a plurality of extended surfaces may be selectively located on the inside face of one or more projections extending from either the first heat sink piece 102 or the second heat sink piece 104. For example, referring to FIGS. 4 and 6, a plurality of extended surfaces 120 are selectively located on the first inside face 114 on the second projection 124 of the first heat sink piece 102.

The first heat sink piece 102 may have a thermal mass block 126 (best viewed in FIGS. 1, 2, 3, 4 and 5) which is located proximate to the board side 168 of the unpackaged die 158, and which also projects out of the plane of the first heat sink piece 102. The thermal mass block 126 provides a large cross-sectional area to conductively remove heat from the unpackaged die 158 to a supplemental thermal enhancement (not illustrated). The thermal mass block may be thermally connected to the supplemental thermal enhancement by using a mechanically compliant and thermally conductive external interface pad 128, such as a aluminum oxide filled silicone elastomer pad, or other thermal conductive interface means such as, but not limited to: thermally conductive grease, thermally conductive wax, thermally conductive epoxy, thermally conductive screws or the like.

Figure 7:
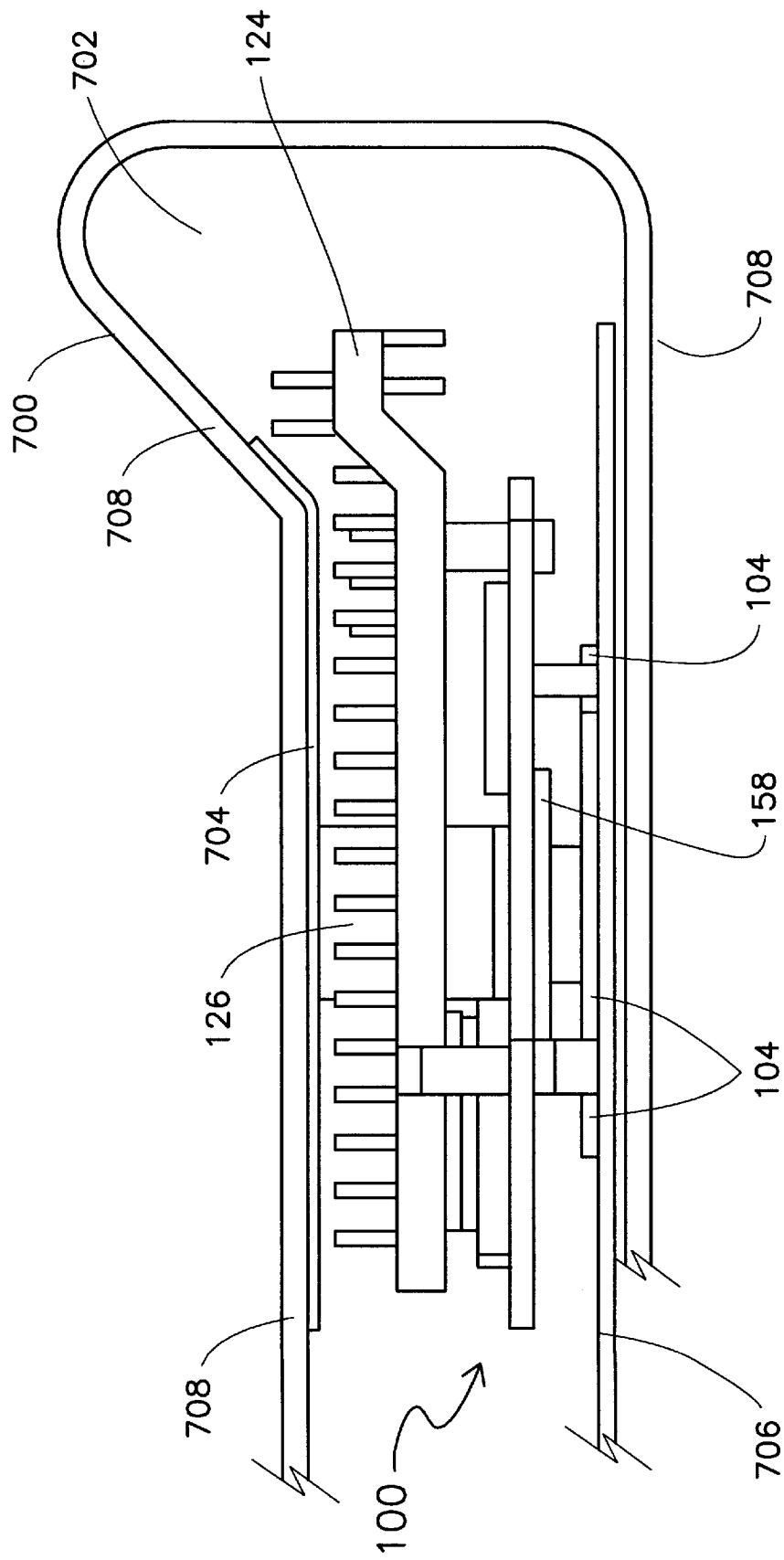
FIG. 7 is a front elevation view of an embodiment of the thermal management structure.

Referring now to FIG. 7 the thermal management structure 100 is illustrated in a front elevation view inside an end product 700 (partially illustrated). The end product 700 has a plurality of electrical terminals and signal terminals (not illustrated) which are interconnected (not illustrated) to the chip-on-board substrate 150 and a chassis 708 for receiving and containing the thermal management structure 100. The end product 700 could be one of a number of end products which use semiconductor devices, including, but not limited to: a personal digital assistant, a lap top computer, a notebook computer, a sub-notebook computer, a desktop computer, a printer, a scanner, a modem or the like.

As discussed above a projection, such as the second projection 124, can be used to extend the heat sink mass into an available space 702 of the end product. Also as discussed above, the thermal mass block 126 may be thermally connected to a supplemental thermal enhancement. Here, a thermally conductive first end product component 704 may be thermally connected to the thermal mass block 126. The first end product component 704 is used to further conductively spread heat to distant points within the end product 700. Similarly, the second heat sink piece 104 may be thermally connected to a thermally conductive second end product component 706, also used to further conductively spread heat to other distant points within the end product 700. The first and second end product components 704 and 706 may be any end product component which will not be damaged by the conducted heat, such as, but not limited to: a chassis, frame, superstructure, case or the like.

Figure 8:
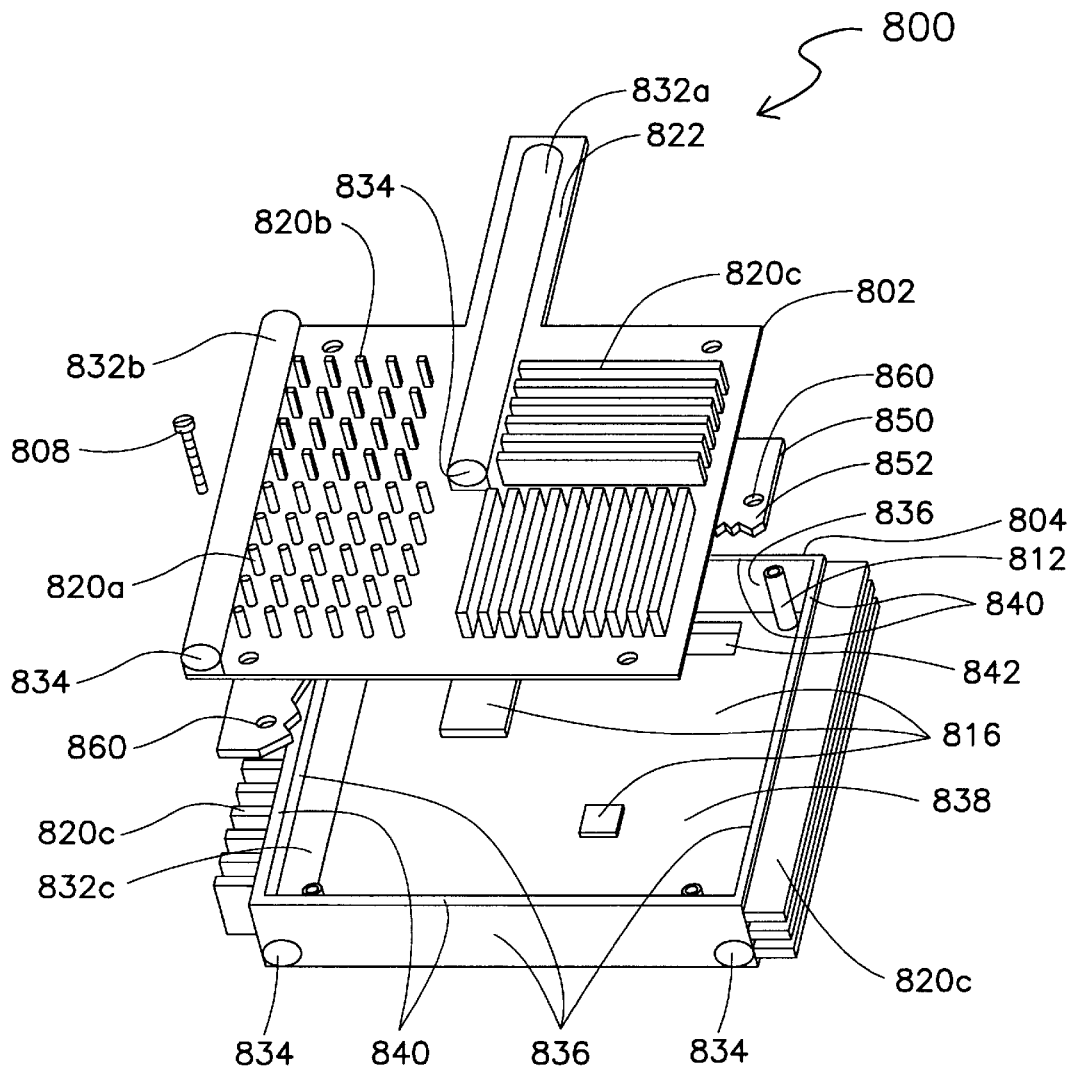
FIG. 8 is an exploded perspective view of another embodiment of the thermal management structure.
Figure 9:
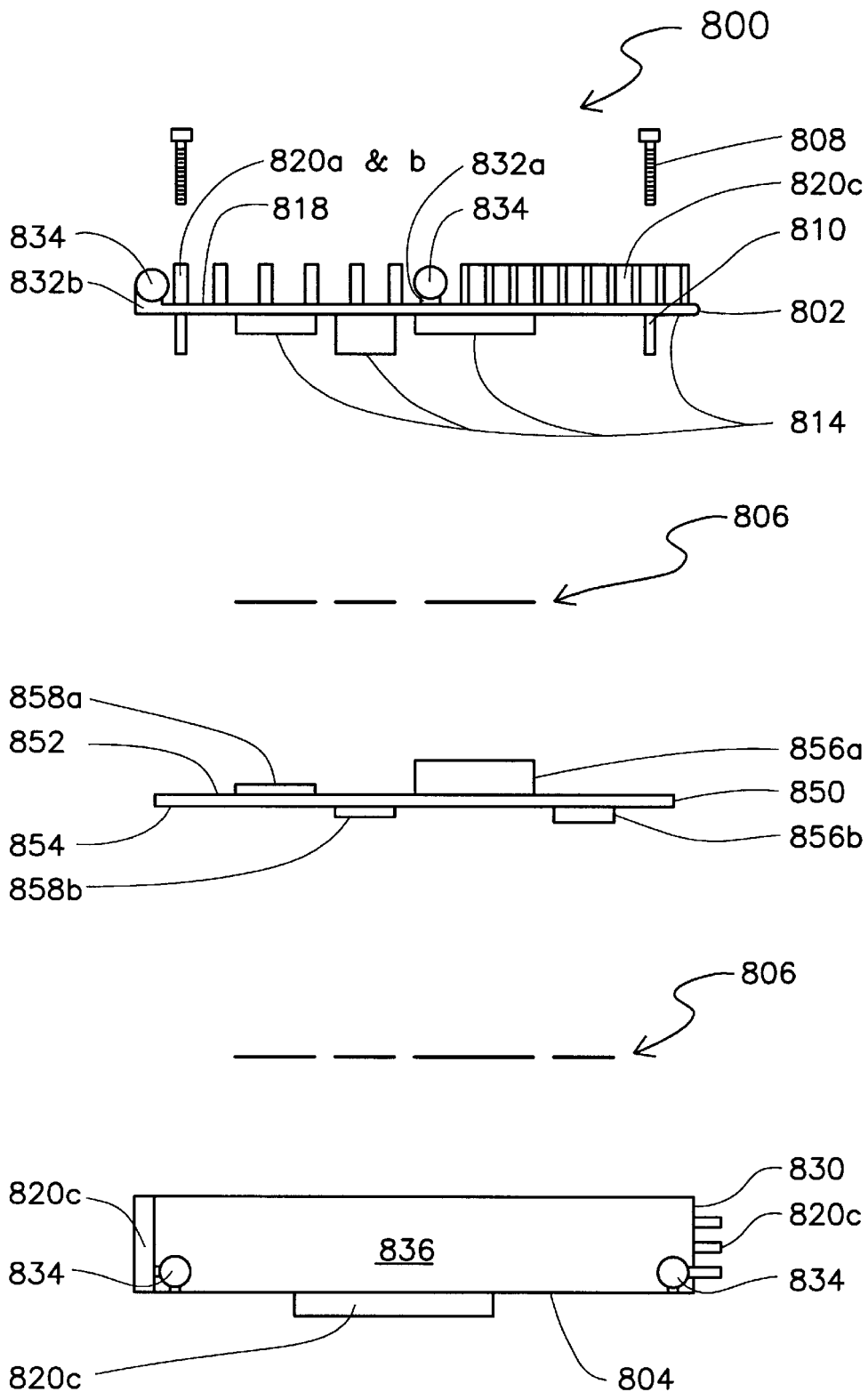
FIG. 9 is an exploded front elevation view of another embodiment of the thermal management structure.

Referring now to FIGS. 8 and 9, another embodiment of a thermal management structure 800 is illustrated in an exploded perspective view (partially illustrated in FIG. 8) and exploded front elevation view (FIG. 9). The thermal management structure 800 comprises four main parts: a first heat sink piece 802, a second heat sink piece 804, a plurality of thermal interface pads 806, and a plurality of fasteners 808. For the purpose of illustrative clarity, and not limitation, FIG. 8 only illustrates the first heat sink piece 802 and second heat sink piece 804 and a portion of a substrate 850 illustrated as a cutaway.

The thermal management structure 800 is in a thermal and mechanical functional cooperation with the substrate 850. The substrate 850 has a first side 852 and a second side 854, a plurality of packaged dice 856*a* and *b* (best viewed in FIG. 9), a plurality of unpackaged die 858*a* and *b* (best viewed in FIG. 9), and a plurality of mounting sites 860 (best viewed in FIG. 8). For the purpose of illustrative clarity, and not limitation, the plurality of mounting sites 860 are illustrated as holes, however, it is contemplated and with in the spirit of the present invention that some or all of the mounting sites may be holes, slots, grooves, pins or the like.

For the purpose of illustrative clarity, and not limitation, the plurality of packaged dice 856*a* and *b* are mounted respectively on the first side 852 and the second side 854 of substrate 850 and the plurality of unpackaged dice 858*a* and *b* are mounted respectively on the first side 852 and the second side 854 of substrate 850 (best viewed in FIG. 9). The selection, number and relative positioning of unpackaged and packaged dice on a given substrate is outside the scope of the present invention. It is contemplated, however, and within the scope of the present invention, that the thermal management structure 800 may be adapted to functionally cooperate with a wide variety of unpackaged and/or packaged dice mounted on either or both sides of a substrate.

Sites on the substrate 850 are selected which have sufficient waste heat generation so as to require thermal enhancement to remove the waste heat. It is contemplated and within the scope of the present invention, that a substrate may have only one site or a plurality of sites which may require thermal enhancement to remove generated waste heat. For the purpose of illustration, and not limitation, it should be assumed that the plurality of packaged dice 856*a* and *b* and the plurality of unpackaged dice 858*a* and *b* all generate sufficient waste heat and require thermal enhancement on both the board side and the exposed face side of each die.

The plurality of thermal interface pads 806 are selected and sized to engage the selected sites on the substrate 850 requiring thermal enhancement. Preferably the length and breadth of the thermal interface pads 806 will be equal to or less than the corresponding length and breadth of the selected sites. The interface pads 806 are a mechanically compliant and thermally conductive material. Preferably the interface pads 806 are aluminum oxide filled silicone elastomer pads. It is contemplated and within the scope of the present invention, however, the interface pads 806 may be a thermally conductive grease, thermally conductive wax, thermally conductive elastomeric pad or the like, provided the interface pad is mechanically compliant and thermally conductive.

Referring to FIG. 9, the interface pads 806 are interposed between the selected sites on the substrate 850 and either a first inside face 814 (best viewed in FIG. 8) of the first heat sink piece 802 or a second inside face 816 (best viewed in FIG. 9) of the second heat sink piece 804. The thicknesses of the interface pads 806 should each be slightly greater than the distances separating the respective surfaces which they each thermally interconnect. By so doing each interface pad will be provided with sufficient compressive force to conform the interface pad to the respective surfaces, while simultaneously not subjecting the packaged dice 856*a* and *b*, the unpackaged dice 858*a* and *b*, or substrate 850 to any damaging compressive force or deflection.

The first and second heat sink pieces 802 and 804 preferably are fabricated from an aluminum alloy, and most preferably fabricated from a beryllium aluminum alloy. It is contemplated and within the scope of the present invention, however, that the first and second heat sink pieces 802 and 804, respectively, may be fabricated from a magnesium alloy, a copper alloy, a beryllium copper alloy, a carbon fiber composite, a thermally conductive plastic or any other material with good thermal conductive properties and mechanical rigidity. Preferably the material also has electromagnetic shielding properties. It is further contemplated and within the scope of the present invention that either or both the first and second heat sink pieces 802 and 804 may be fabricated by die casting, stamping, extruding, molding, injection molding, powdered metal forming or the like.

Preferably both the first heat sink piece 802 and the second heat sink piece 804 are fabricated by die casting.

The first heat sink piece 802 has a plurality of first offsetting mounting brackets 810 (best viewed in FIG. 9), and the second heat sink piece 804 has a plurality of second offsetting mounting brackets 812 (best viewed in FIG. 8). The first plurality of offsetting mounting brackets 810 correspond and align with the plurality of mounting sites 860 on the substrate 850, which further correspond and align with the plurality of second offsetting mounting brackets 812.

The first offsetting mounting brackets 810 align with the mounting sites 860 and rigidly engage the first side 852 of substrate 850. The second offsetting mounting brackets 812 align with the mounting sites 860 and rigidly engage the second side 854 of substrate 850. Fasteners 808 are used to fasten and firmly secure the first offsetting mounting brackets 810 to the second offsetting mounting brackets 812, thereby sandwiching the substrate 850 in an unmoving relationship between the first heat sink piece 802 to the second heat sink piece 804, and also compressing the interposed interface pads 806. By sandwiching and fixedly fastening the substrate 850 between the first and second heat sink pieces 802 and 804, the fragile unpackaged dice 858*a* and *b* are mechanically isolated and therefore much less likely to be subjected to mechanical trauma during normal handling. The fasteners 808 are preferably screws, however, it is contemplated and within the scope of the present invention that alternate fastening means may be employed, such as bolts and nuts, pins, clips, adhesives, glues, epoxies or the like.

A first outer face 818 of the first heat sink piece 802 and a second outer face 830 of the second heat sink piece 804 are selectively populated with a plurality of extended surfaces 820*a, b* and *c* which are thermally conductive. The plurality of extended surfaces 820*a, b* and *c* increase the surface area to mass ratio, thereby increasing the convective and radiant transfer of heat to the ambient environment. Preferably the plurality of extended surfaces 820*a, b* and *c* are cylindrical pins 820*a*. It is contemplated and within the scope of the present invention, however, that the plurality of extended surfaces 820*a, b* and *c* may be cylindrical pins 820*a*, non-cylindrical pins 820*b* and/or ribs 820*c*. It is contemplated and within the scope of the present invention that a plurality of extended surfaces may be selectively located on either, both, or neither the first heat sink piece 802 and/or the second heat sink piece 804.

Another aspect of the present invention is that the first heat sink piece 802 and the second heat sink piece 804 can each be shaped and sized independent of each other to conform to the space available in a specific end product while providing heat pathways to cooler distant points in the end product. Either or both of the first and second heat sink pieces 802 and 804 may have projections which extend the plane and/or project out of the plane of the heat sink piece. For the purposes of illustration, and not limitation, the first heat sink piece 802 has a projection 822 which extends the heat sink mass in the plane of the first heat sink piece 802 (best viewed in FIG. 8).

Another aspect of the present invention is that the first heat sink piece 802 and/or the second heat sink piece 804 may have one or more heat pipe receptacles 832*a, b* and *c* for holding heat pipes 834. The heat sink receptacles may extend the main plane of the heat sink piece (such as 832*a*) and/or project out of the main plain of the heat sink piece (such as 832*a* and *b*) to enhance heat removal to distant points. The heat pipe receptacles may be positioned proximate to the substrate 850 (such as 832*c*) to more evenly distribute waste heat across the heat sink piece.

The heat pipes 834 are sealed cavities which are filled with a coolant (e.g. Water, HFC's, CFC's or the like). A partial volume of the cavity is occupied by the coolant in the liquid phase and the remaining cavity volume is filled with the coolant in the vapor phase. A heat pipe can efficiently and rapidly transfer large quantities of heat by convective heat transfer via boiling the liquid coolant (evaporative cooling) with the heat source and then condensing the vapor coolant back to a liquid with the cooler ambient environment. The heat pipe cavity may further contain a wicking material to move the liquid phase to the point of evaporation (i.e. the heat source) via capillary action. A wicking material eliminates the need for the heat pipe to be maintained in a specific orientation so that gravitational forces may transport the liquid to a low point near the heat source.

Another aspect of the present invention is that one of the two heat sink pieces may have a lip which is shaped and sized to both encircle the edges of the substrate and electromagnetically seal against the inside surface of the other heat sink piece thereby providing an electromagnetic shield around the substrate.

Referring to FIGS. 8 and 9, for the purpose of illustration, and not limitation, the second heat sink piece 804 has a lip 836 which extends away from the second inside face 816 and forms a cavity 838. It is contemplated and within the scope of the present invention, however, that the lip could be formed on the first heat sink piece 802. Here, the lip 836 is sized and shaped to allow the substrate 850 to be inserted into the cavity 838. The lip 836 also has a seal edge 840 which seals against the first inside face 814 of the first heat sink piece 802 to form an electromagnetic seal. When the substrate 850 is enclosed in the cavity 838, and the first and second heat sink pieces 802 and 804 have been fastened together, the two heat sink pieces 802 and 804 together with the lip 836 function as an electromagnet shield which isolates any electromagnet fields generated by the substrate 850 from the electromagnetic environment surrounding the thermal management structure 800. The second heat sink piece 804 also has an opening 842 which allows the electrical interconnection of the substrate 850 with a plurality of external electrical terminals (not illustrated) and external signal terminals (not illustrated).

The lip 836 may optionally serve two other useful functions. First the lip 836 may be fabricated to closely contour one or more edges or surfaces of the substrate 850 to further assist in the alignment of the substrate 850 in a predetermined configuration with the second heat sink piece 804 and mounting brackets 812. Second, the lip 836 may be used as a spacer, or offset, which defines and maintains a predetermined minimum distance between the first inside face 814 of the first heat sink piece 802 and the second inside face 816 of the second heat sink piece 802.

Figure 10:
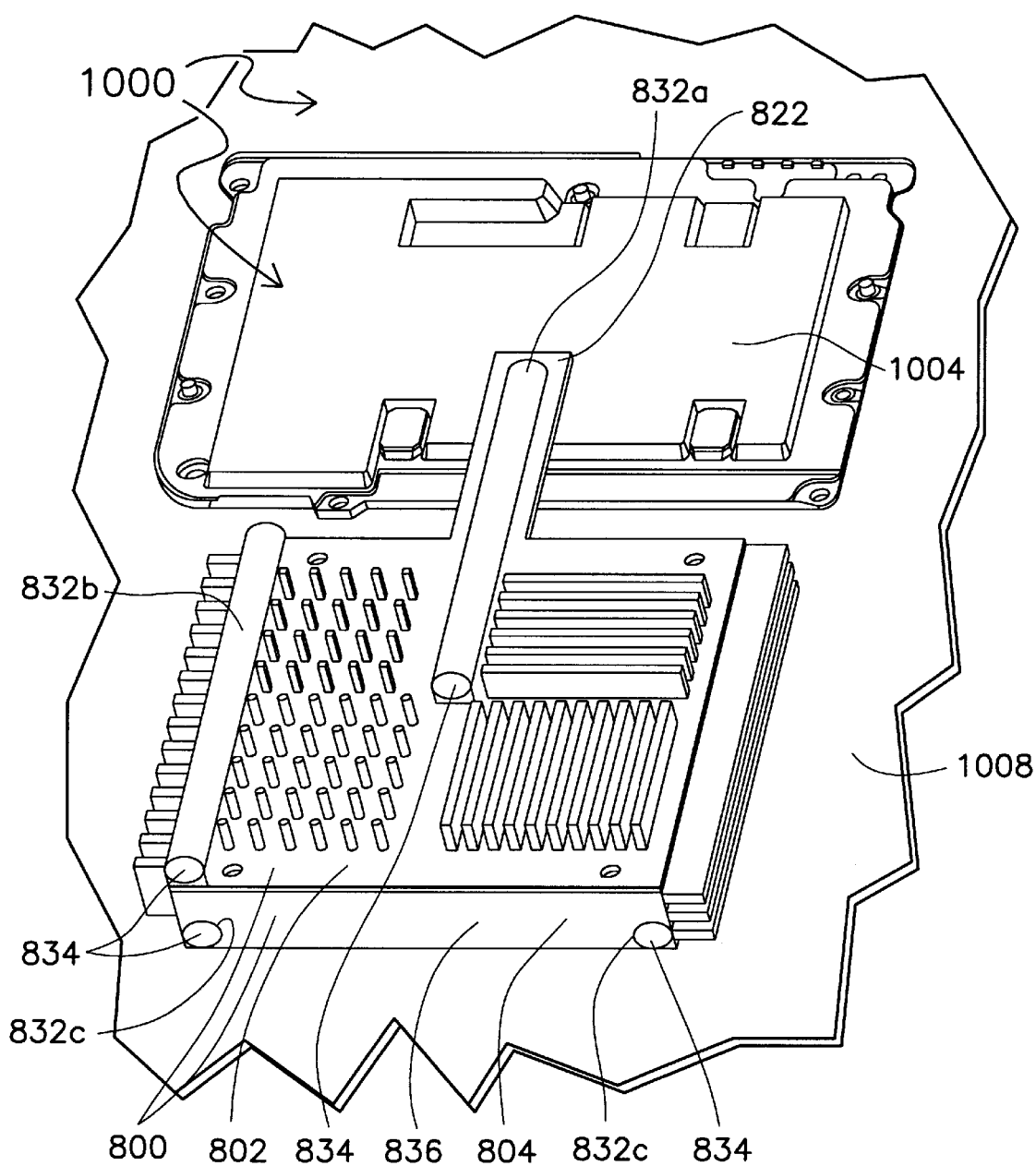
FIG. 10 is a perspective view of another embodiment of the thermal management structure.

Referring now to FIG. 10, another embodiment of the thermal management structure 800 is illustrated in an exploded perspective view inside an end product 1000 (partially illustrated). The end product 1000 has a plurality of electrical terminals and signal terminals (not illustrated) which are interconnected (not illustrated) to the substrate 850 (not illustrated). The end product 1000 also has a chassis 1008 for receiving and containing the thermal management structure 800. The end product 1000 could be one of a number of end products which use semiconductor devices, including, but not limited to: a personal digital assistant, a lap top computer, a notebook computer, a sub-notebook computer, a desktop computer, a printer, a scanner, a modem or the like.

As discussed above a projection, such as the first projection 822, can be used to extend the heat sink mass into an available space of the end product. Also the heat pipe receptacles 832a and c having heat pipes 834 may be thermally connected to supplemental thermal sinks. Here, a thermally conductive first end product component 1004 may be thermally connected to the heat pipe receptacle 832a having a heat pipe 834. The heat pipe 834 contained in the heat pipe receptacle 832a convectively transfers waste heat from the thermal management structure 800 to the first end product component 1004. The first end product component 1004 then further conductively spreads the waste heat to distant points within the end product 1000.

Similarly, the second heat sink piece 804 may be thermally connected to a thermally conductive second end product component 1008 (the chassis), also used to further conductively spread heat to other distant points within the end product 1000. The heat sink receptacles 832c having heat pipes 834 convectively distribute the waste heat across the second heat sink piece 804, thereby providing maximum thermal communication with the second end product component 1008. The first and second end product components 1004 and 1008 may be any end product component which will not be damaged by the conducted heat, such as, but not limited to: a chassis, frame, superstructure, case or the like.

Figure 11:
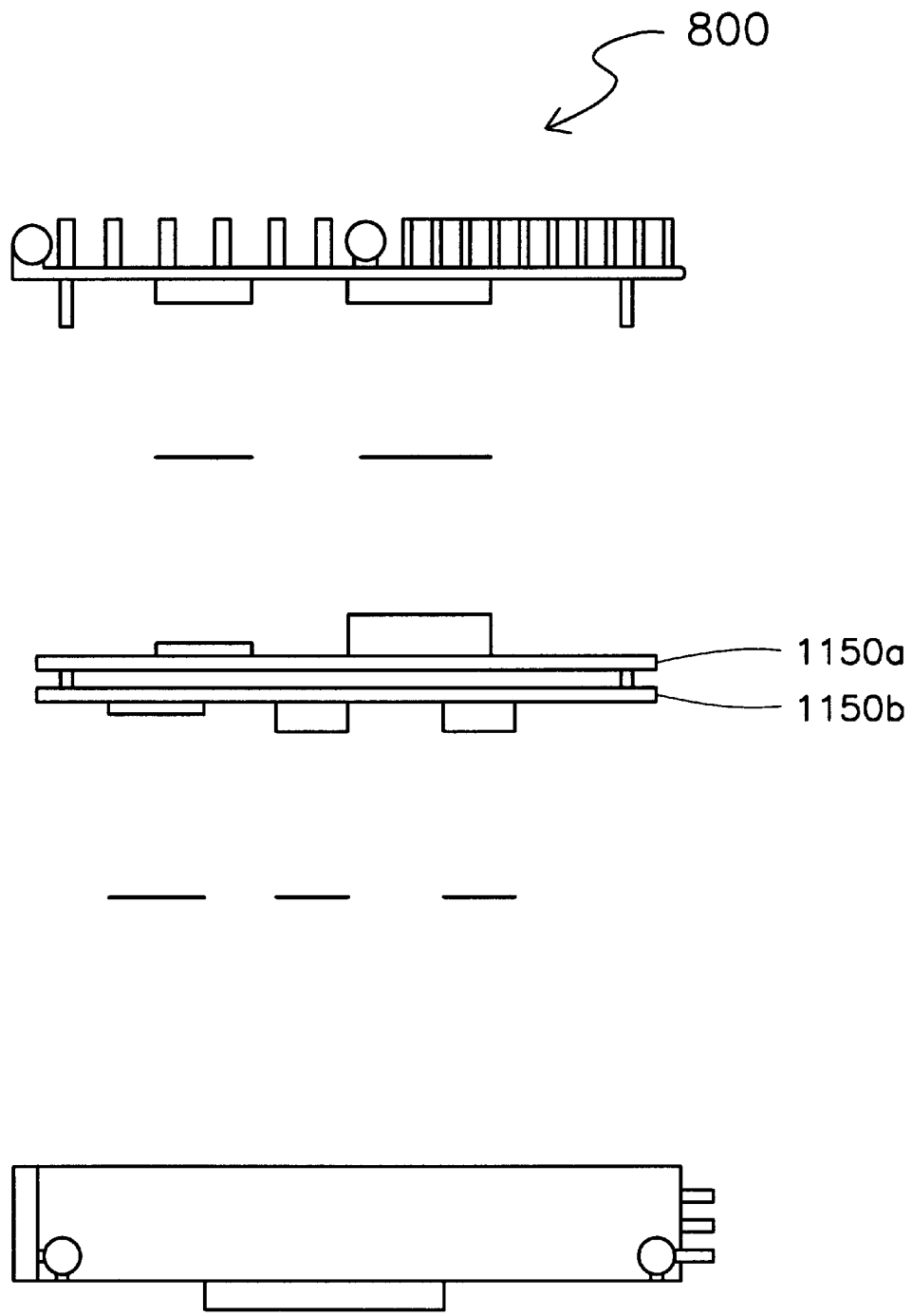
FIG. 11 is an exploded front elevation view of another aspect of the thermal management structure.

Referring now to FIG. 11, an aspect of the present invention is illustrated in exploded front elevation view. The thermal management structure 800 may be used with a bi-planar substrate assembly of two substrates 1150a and b arranged and interconnected as parallel planes which operate both electrically and mechanically as a single unit. The selection of a single substrate 850 or a biplanar substrate 1150a and b, and the relative positioning of the bi-planar substrates 1150a and b with respect to each other (i.e. the relative position of substrate 1150a with respect to substrate 1150b) is outside the scope of the present invention. It is contemplated, however, and within the scope of the present invention, that the thermal management structure 800 may be adapted to functionally cooperate with a wide variety of unpackaged and/or packaged dice mounted on either or both sides of a bi-planar substrate 1150a and b.

Figure 12:
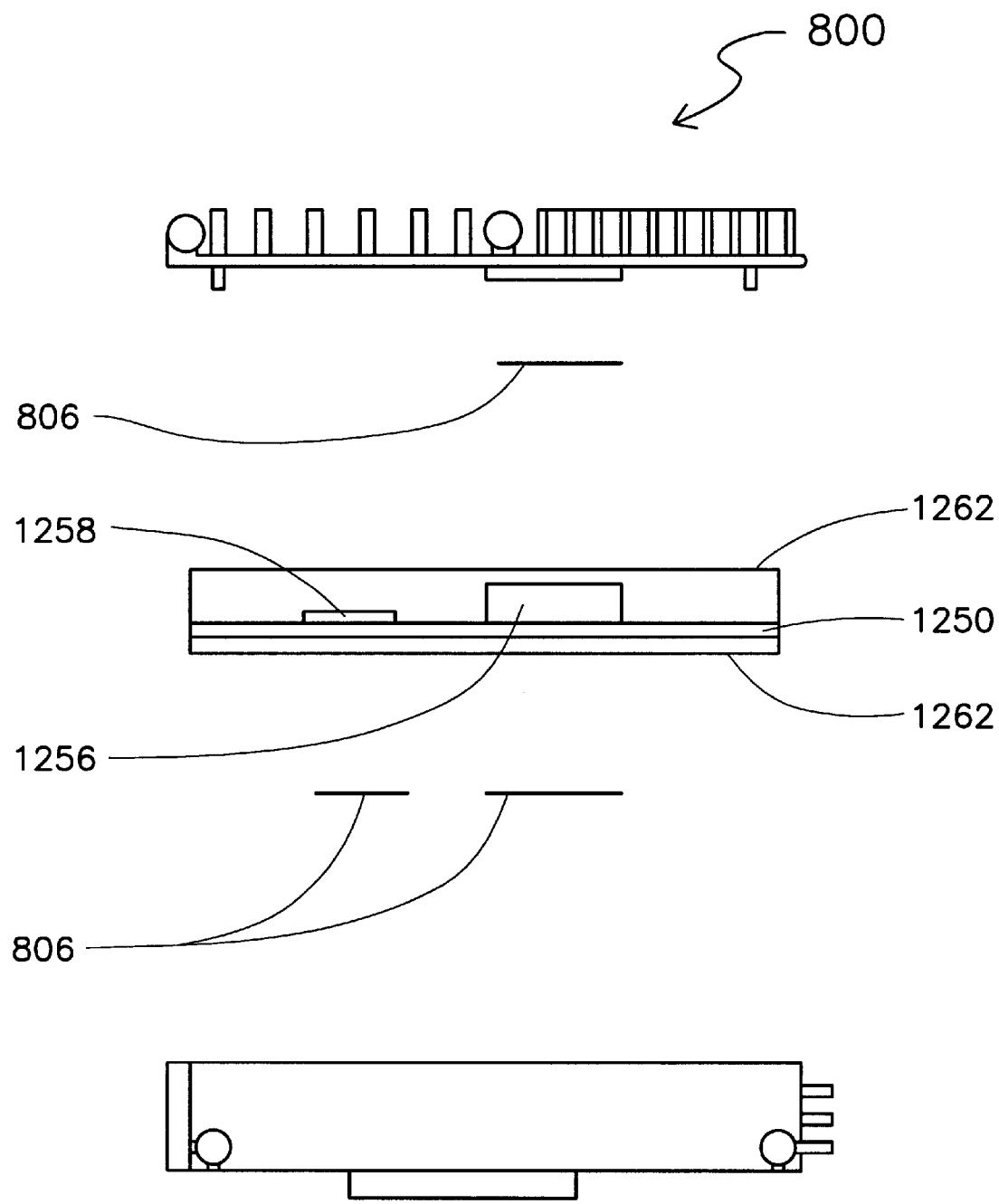
FIG. 12 is an exploded front elevation view of an aspect of the thermal management structure.

Referring now to FIG. 12, another aspect of the present invention is illustrated in exploded front elevation view. The thermal management structure 800 may be used with a substrate 1250 which has been enclosed in a thin walled enclosure 1262. The thin walled enclosure 1262 is a mechanically protective enclosure which has been placed around the substrate 1250 to prevent accidental touchings of the substrate 1250 and any packaged dice 1256 and/or unpackaged dice 1258 on the substrate 1250. Under circumstances where it is not desirable and/or not possible to remove the thin walled enclosure 1262 from the substrate 1250, the thermal management structure 800 can be easily adapted to accommodate the thin walled enclosure 1262.

As viewed in FIG. 12, the thermal interface pads 806 are positioned outside the thin walled enclosure 1262 proximate to the packaged dice 1256 and/or unpackaged dice 1258 which need thermal enhancement to remove waste heat. When the thin walled enclosure 1262 is fixedly mounted within the thermal management structure 800, the thermal interface pads 806 will engage the sites on the thin walled structure 1262 which need thermal enhancement in a mechanically compliant and thermally conductive manner.

The present invention, therefore, is well adapted to carry out the objects and attain the ends and advantages mentioned, as well as others inherent therein.

While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to particularly preferred embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A thermal management structure for a substrate, the thermal management structure comprising:

a substrate having a first side, a second side, a plurality of edges connecting the first side and the second side, a semiconductor die mounted on the second side, the semiconductor die having an exposed face;

a first heat sink piece having a first face and a first plurality of mounting brackets, the first face proximate to the first side of the substrate and the first plurality of mounting brackets rigidly engaging the first side of the substrate;

a second heat sink piece having a second face and a second plurality of mounting brackets, the second face proximate to the exposed face of the semiconductor die mounted on the second side of the substrate and the second plurality of mounting brackets rigidly engaging the second side of the substrate;

a first interface means interposed between and compliantly engaging the first side of the substrate and the first face of the first heat sink piece, the first interface means proximate to the semiconductor die whereby the first interface means conductively transfers heat from the semiconductor die to the first heat sink piece;

a second interface means interposed between and compliantly engaging the exposed face of the semiconductor die and the second face of the second heat sink piece whereby the second interface means conductively transfers heat from the semiconductor die to the second heat sink piece; and a plurality of fasteners, the fasteners fixedly connecting the first plurality of mounting brackets to the second plurality of mounting brackets.

2. The thermal management structure according to claim 1, wherein the first interface means is a first interface pad.

3. The thermal management structure according to claim 1, wherein the second interface means is a second interface pad.

4. The thermal management structure according to claim 1, wherein the first interface means is a first aluminum oxide filled silicone elastomeric pad.

5. The thermal management structure according to claim 1, wherein the second interface means is a second aluminum oxide filled silicone elastomeric pad.

6. The thermal management structure according to claim 1, wherein the first interface means is a thermally conductive wax.

7. The thermal management structure according to claim 1, wherein the second interface means is a thermally conductive wax.

8. The thermal management structure according to claim 1, wherein the first interface means is a thermally conductive grease.

9. The thermal management structure according to claim 1, wherein the first heat sink piece is an aluminum alloy and the second heat sink piece is an aluminum alloy.

10. The thermal management structure according to claim 1, wherein the material used for the first heat sink piece and the second heat sink piece is selected from the group consisting of a magnesium alloy, a copper alloy, a beryllium copper alloy, a beryllium aluminum alloy, a carbon fiber composite and a thermally conductive plastic.

11. The thermal management structure according to claim 1, wherein the semiconductor die is an unpackaged semiconductor die.

12. The thermal management structure according to claim 1, wherein the semiconductor die is a packaged semiconductor die.

13. The thermal management structure according to claim 1, wherein the semiconductor die is a microprocessor die.

14. The thermal management structure according to claim 1, wherein the substrate is a multi chip module.

15. The thermal management structure according to claim 1, wherein the first heat sink piece is made of a castable material.

16. The thermal management structure according to claim 1, wherein the second heat sink piece is made of a castable material.

17. The thermal management structure according to claim 1, wherein the first heat sink piece has at least one heat pipe.

18. The thermal management structure according to claim 1, wherein the second heat sink piece has at least one heat pipe.

19. The thermal management structure according to claim 1, further comprising:

an end product component, the end product component having an attachment surface; and the first heat sink piece having an outer face, the outer face thermally engaging the attachment surface of the end product component, whereby heat is conducted from the first heat sink piece to the end product component.

20. The thermal management structure according to claim 19, wherein the first heat sink piece having a heat pipe proximate to the end product component, whereby heat is convectively transferred from the first heat sink piece to the end product component.

21. The thermal management structure according to claim 1, further comprising:

an end product component, the end product component having an attachment surface; and the second heat sink piece having an outer face, the outer face thermally engaging the attachment surface of the end product component, whereby heat is conducted from the second heat sink piece to the end product component.

22. The thermal management structure according to claim 21, wherein the second heat sink piece having a heat pipe proximate to the end product component, whereby heat is convectively transferred from the second heat sink piece to the end product component.

23. The thermal management structure according to claim 1, wherein the first heat sink piece having a plurality of extended surfaces.

24. The thermal management structure according to claim 23, wherein the plurality of extended surfaces are a plurality of pins.

25. The thermal management structure according to claim 23, wherein the plurality of extended surfaces are a plurality of ribs.

26. The thermal management structure according to claim 1, wherein the second heat sink piece having a plurality of extended surfaces.

27. The thermal management structure according to claim 26, wherein the plurality of extended surfaces are ribs.

28. The thermal management structure according to claim 1, wherein the second heat sink piece having a lip on the outer periphery of the second face, the lip and the second face defining a cavity, the lip encircling the plurality of edges on the substrate, the lip extending perpendicularly from the second face of the second heat sink to the first face of the first heat sink, the lip sealably engaging the first face of the first heat sink, whereby the second heat sink, the lip and the first heat sink enclose the substrate in the cavity and isolate the substrate from electromagnetic fields external to the thermal management structure.

29. The thermal management structure according to claim 1, wherein the substrate is a bi-planar pair of electrically and mechanically connected substrates.

30. The thermal management structure according to claim 1, wherein the substrate is enclosed in a thin walled enclosure, the thin walled enclosure proximate to the substrate and the exposed face of the semiconductor die, the thin walled enclosure having a first portion disposed between the substrate and the first interface means, and the thin walled enclosure having a second portion disposed between the exposed face of the semiconductor die and the second interface means.

31. A method of mechanically and electromagnetically isolating and thermally managing a substrate, comprising the steps of:

providing a substrate having a first side, a second side, a semiconductor die mounted on the second side, the semiconductor die having an exposed face;

providing a first heat sink piece having a first face, a lip and a first plurality of mounting brackets, the first face and the lip describing a cavity;

providing a second heat sink piece having a second face and a second plurality of mounting brackets;

interposing a first thermally conductive interface between the first side of the substrate and the first face of the first heat sink piece;

inserting the first thermally conductive interface and the substrate into the cavity;

compressively engaging the first thermally conductive interface between the first side of the substrate and the first face of the first heat sink piece;

rigidly engaging the first plurality of mounting brackets of the first heat sink piece with the first side of the substrate;

interposing a second thermally conductive interface between the exposed face of the semiconductor die and the second face of the second heat sink piece;

compressively engaging the second thermally conductive interface between the exposed face of the semiconductor die and the second face of the second heat sink piece; and rigidly engaging the second plurality of mounting brackets of the second heat sink piece with the second side of the substrate and sealably engaging the lip of the first heat sink piece with the second face of the second heat sink piece, thereby forming a single module semiconductor device.

32. The method of claim 31, further comprising the steps of:

providing an end product;

handling the single module semiconductor device; and installing the single module semiconductor device in the end product.

33. The method of claim 32, further comprising the step of:

thermally connecting the first heat sink piece to the end product.

34. The method of claim 32, further comprising the step of:

thermally connecting the second heat sink piece to the end product.

35. An electronic system having thermal management and mechanical and electromagnetic isolation of a substrate, the electronic system comprising:

a substrate having a first side, a second side, an semiconductor die mounted on the second side, the semiconductor die having an exposed face;

a first heat sink piece having a first face, a lip and a first plurality of mounting brackets, the lip and first face describing a cavity, the first face proximate to the first side of the substrate, the lip encircling the substrate, and the first plurality of mounting brackets rigidly engaging the first side of the substrate;

a second heat sink piece having a second face and a second plurality of mounting brackets, the second face proximate to the exposed face of the semiconductor die mounted on the second side of the substrate, the second plurality of mounting brackets rigidly engaging the second side of the substrate, and the second face sealably engaging the lip of the first heat sink piece;

a first interface means interposed between and compliantly engaging the first side of the substrate and the first face of the first heat sink piece, the first interface means proximate to the semiconductor die whereby the first interface means conductively transfers heat from the semiconductor die to the first heat sink piece;

a second interface means interposed between and compliantly engaging the exposed face of the semiconductor die and the second face of the second heat sink piece whereby the second interface means conductively transfers heat from the semiconductor die to the second heat sink piece;

a plurality of fasteners, the fasteners fixedly connecting the first plurality of mounting brackets to the second plurality of mounting brackets, thereby forming a thermal management structure; and an electronic system having a plurality of electrical terminals, signal terminals and a chassis, the plurality of electrical terminals interconnected to the substrate, the plurality of signal terminals interconnected to the substrate, and the chassis containing the thermal management structure.

36. The system of claim 35, wherein the electronic system has a plurality of electronic components, at least one of the plurality of electronic components being thermally connected to the thermal management structure, whereby heat is transferred from the thermal management structure to heat dissipating areas within the electronic system.

37. The system of claim 35, wherein the first heat sink piece has at least one heat pipe and the electronic system has a plurality of electronic components, at least one of the plurality of electronic components being thermally connected to the at least one heat pipe of the first heat sink piece, whereby heat is transferred from the first heat sink piece to heat dissipating areas within the electronic system.

38. The system of claim 35, wherein the second heat sink piece has at least one heat pipe and the electronic system has a plurality of electronic components, at least one of the plurality of electronic components being thermally connected to the at least one heat pipe of the second heat sink piece, whereby heat is transferred from the second heat sink piece to heat dissipating areas within the electronic system.

39. The system of claim 35, wherein the electronic system is a personal digital assistant.

40. The system of claim 35, wherein the electronic system is a lap top computer.

41. The system of claim 35, wherein the electronic system is a notebook computer.

42. The system of claim 35, wherein the electronic system is a sub-notebook computer.

43. The system of claim 35, wherein the electronic system is a desktop computer.

44. The system of claim 35, wherein the electronic system is a printer.

45. The system of claim 35, wherein the electronic system is a scanner.

46. The system of claim 35, wherein the electronic system is a modem.

47. An computer system having thermal management and mechanical and electromagnetic isolation of a substrate, the computer system comprising:

a substrate having a first side, a second side, an unpackaged microprocessor die mounted on the second side, the unpackaged microprocessor die having an exposed face;

a first heat sink piece having a first face, a lip and a first plurality of mounting brackets, the lip and first face describing a cavity, the first face proximate to the first side of the substrate, the lip encircling the substrate, and the first plurality of mounting brackets rigidly engaging the first side of the substrate;

a second heat sink piece having a second face and a second plurality of mounting brackets, the second face proximate to the exposed face of the unpackaged microprocessor die mounted on the second side of the substrate, the second plurality of mounting brackets rigidly engaging the second side of the substrate, and the second face sealably engaging the lip of the first heat sink piece;

a first interface means interposed between and compliantly engaging the first side of the substrate and the first face of the first heat sink piece, the first interface means proximate to the unpackaged microprocessor die whereby the first interface means conductively transfers heat from the unpackaged microprocessor die to the first heat sink piece;

a second interface means interposed between and compliantly engaging the exposed face of the unpackaged microprocessor die and the second face of the second heat sink piece whereby the second interface means conductively transfers heat from the unpackaged microprocessor die to the second heat sink piece;

a plurality of fasteners, the fasteners fixedly connecting the first plurality of mounting brackets to the second plurality of mounting brackets, thereby forming a thermal management structure; and an computer system having a plurality of electrical terminals, signal terminals and a chassis, the plurality of electrical terminals interconnected to the substrate, the plurality of signal terminals interconnected to the substrate, and the chassis containing the thermal management structure.

\* \* \* \* \*